United States Patent [19]

Yanagida

[11] Patent Number: 5,338,399

[45] Date of Patent: Aug. 16, 1994

[54] DRY ETCHING METHOD

[75] Inventor: Toshiharu Yanagida, Kanagawa, Japan

[73] Assignee: Sony Corporation, Tokyo, Japan

[21] Appl. No.: 834,395

[22] Filed: Feb. 12, 1992

[30] Foreign Application Priority Data

Feb. 12, 1991 [JP] Japan .................. 3-040966

[51] Int. Cl.$^5$ ............................ H01L 21/00
[52] U.S. Cl. .................. 156/662; 156/643; 156/646; 156/662; 156/653; 156/657
[58] Field of Search .......... 156/643, 646, 662, 653, 156/657

[56] References Cited

U.S. PATENT DOCUMENTS

| | | | |
|---|---|---|---|
| 4,162,185 | 7/1979 | Coburn et al. | 156/646 |
| 4,581,101 | 4/1986 | Senoue et al. | 156/646 |
| 4,807,016 | 2/1989 | Douglas | 156/653 |
| 4,956,043 | 9/1990 | Kanetomo et al. | 204/298.31 |
| 5,038,713 | 8/1991 | Kawakami et al. | 156/345 |
| 5,176,790 | 1/1993 | Arleo et al. | 252/79.1 |

FOREIGN PATENT DOCUMENTS

| | | |
|---|---|---|
| 57-108267 | 7/1982 | Japan . |
| 60-077429 | 5/1985 | Japan . |

Primary Examiner—R. Bruce Breneman
Assistant Examiner—George Goudreau
Attorney, Agent, or Firm—Hill, Steadman & Simpson

[57] ABSTRACT

A method for dry etching for forming a contact hole in a silicon oxide interlayer insulating film is proposed, by which high etchrate, high selectivity, low pollution and low damage may be achieved. An etching gas containing cyclic saturated fluorocarbon compounds, such as octafluorocyclobutane (c-$C_4F_8$), or cyclic unsaturated fluorocarbon compounds, such as hexafluorocyclobutene (c-$C_4F_6$), is used, and the wafer temperature is controlled to be 50° C. or lower. Both of the compounds are higher fluorocarbon compounds having three or more carbon atoms and yield more $CF_x{}^+$ radicals per molecule than does $CF_4$ or the like compound to enable etching with a high etch rate. Besides, as compared with straight-chain saturated fluorocarbon compounds having the same number of carbon atoms, the above compounds exhibit a higher C/F ratio (the ratio of the number of carbon atoms to that of fluorine atoms per molecule) to permit carbonaceous polymers to be deposited effectively. In this manner, high selectivity and low damage basically may be achieved without using deposition gases simultaneously, with the result that low pollution may also be achieved.

14 Claims, 1 Drawing Sheet

DRY ETCHING METHOD

BACKGROUND OF THE INVENTION

1. Field of the Invention

This invention relates to a dry etching method employed for the preparation of semiconductor devices. Note particularly, it relates to a dry etching method for dry etching a layer of a silicon compound at a high etchrate with excellent resist selectivity and silicon underlying layer selectivity with the least risk of pollution by particles.

2. Description of the Related Art

In keeping up with the high integration and high performance of semiconductor ,devices, such as VLSIs and ULSIs of recent origin, technical demands placed on the methods for dry etching of a layer of a silicon compound, exemplified by silicon oxide, are becoming increasingly strict.

That is, the wafer size and the device chip area are increased with increase in the degree of integration, whilst the degree of refinement of the pattern to be formed is also increasing. Consequently, for assuring etching uniformity in a wafer surface, the tendency is towards using a wafer-by-wafer type etching system in preference to the conventional batch type etching system. For maintaining productivity comparable to that achieved heretofore, it is mandatory to elevate the etch rate significantly.

Under the current status of the art in which, for increasing the operation speed and reducing the size of semiconductor devices, the depth of junction of the impurity diffusion region is becoming shallow and a variety of deposited films are reduced in thicknesses, a demand is presented for an etching technique which is more excellent in underlying layer selectivity and less subject to damages than the conventional etching technique. This is the case with etching a silicon oxide interlayer insulating film which is performed with a silicon substrate or a polysilicon layer as an underlying layer for forming a contact to an impurity diffusion region formed in a semiconductor substrate or to a source-drain region of a pMOS transistor used as a resistor load for SRAMs.

It is also mandatory to improve resist selectivity. In submicron devices, even the slightest dimensional loss due to recession of the resist material is not tolerated.

However, such properties as high etchrate, high selectivity and low damages are matters of trade-off such that it is extremely difficult to arrive at an etching process which will satisfy these requirements simultaneously.

Heretofore, when etching a layer of a silicon compound, such as silicon oxide, while maintaining high selectivity against a layer of the silicon-based material, $CHF_3$, a $CF_4/H_2$ mixed system, a $CF_4/O_2$ mixed system or a $C_2F_6/CHF_3$ mixed system has been customarily employed as an etching gas. These etching gases are unanimously based on fluorocarbon based gases having a C/F ratio (the ratio of the number of carbon atoms to that of fluorine atoms) of not less than 0.25. These gas systems are used because (a) the carbon contained in the fluorocarbon gases generates C—O bond having a high interatomic bond energy on the surface of the silicon oxide layer to disrupt or otherwise weaken the Si—O bond of the silicon oxide layer, (b) $CF_x^+$ ions, above all, $CF_3^+$ ions, which are main etchants for the silicon oxide layer, may be generated, and (c) a relatively carbon-rich atmosphere is produced in a plasma and hence oxygen in silicon oxide is removed in the forms of CO or $CO_2$, whereas a carbonaceous polymer is deposited on the surface of the layer of the silicon-based material, due to contribution of C, H or F contained in the gas, thereby lowering the etch rate and improving selectivity against the silicon-based layer.

Meanwhile, the above mentioned addition gases $H_2$ or $O_2$ are used for controlling selectivity and is capable of reducing or increasing the amount of generation of $F^*$ ions, respectively. That is, these addition gases are effective in controlling the apparent C/F ratio of the etching system.

On the other hand, the present Assignee has proposed in JP Patent Publication KOKAI NO. 3-276626 a method for dry etching of a layer of a silicon compound using a saturated or unsaturated straight-chain higher fluorocarbon gas having two or more carbon atoms. With this prior-art dry etching method, higher fluorocarbon gases, such as $C_2F_6$, $C_3F_8$, $C_4F_{10}$ or $C_4F_8$, are used for efficient generation of $CF_x^+$ for raising the etchrate However if the higher fluorocarbon gas is used alone, resist selectivity or silicon underlying layer selectivity can not be increased. Although a high etchrate is achieved when a silicon oxide layer on a silicon substrate is etched using, for example, $C_3F_8$ as an etching gas, resist selectivity is as low as about 1.3 and resistance to etching falls short while the dimensional loss is produced due to pattern edge recession. Resistance to overetching also falls short because silicon selectivity is of the order of 4.1. For overcoming these drawbacks, two-stage etching is used in the above described prior art method in such a manner that etching with the straight-chain higher fluorocarbon gas alone is continued until immediately before the underlying layer is exposed, and etching of the remaining portion of the layer of the silicon compound is performed using the above gas added to by a hydrocarbon based gas for promoting deposition of the carbon-based polymer.

However, under the current status of the art in which the design rule of the semiconductor devices has been refined to a higher extent the dimensional loss in connection with the etching mask is hardly tolerated, such that even with the two-stage etching as described above, it becomes necessary to improve selectivity further during the first-stage etching. Since the effects of pollution by particles of the carbonaceous polymer are feared to become more acute in future with progress in the refinement of the semiconductor design rule, it is highly desirable that the amount of consumption of deposition gases such as hydrocarbon gases during the second stage etching be reduced to as small a value as possible.

In view thereof, the present inventors have already proposed a method of etching a layer of a silicon compound using a straight-chain fluorocarbon gas having at least one unsaturated bond per molecule while the wafer temperature is controlled to a temperature not higher than 50° C. Since the straight-chain unsaturated fluorocarbon gas theoretically yields two or more $CF_x^+$ ions per molecule by discharge dissociation, silicon oxide may be etched at a high etchrate with the use of this etching gas. Polymerization of the carbonaceous polymer is accelerated because the etching gas contains unsaturated bonds in the molecule thereof and tends to produce highly active radicals on dissociation. Besides, deposition of the carbonaceous polymer is accelerated because the wafer temperature is controlled to 50° C. or lower. The result is improved resist selectivity and silicon underlying layer selectivity.

In the above described method by the present inventors, there has also been disclosed a technique in which etching with the straight-chain unsaturated fluorocarbon gas alone is continued until the time the layer of the silicon compound is etched halfway and the remaining portion of etching is performed using the above mentioned straight-chain unsaturated fluorocarbon gas, added to by the hydrocarbon gas, as an etching gas. With this technique, the deposition gas is used simultaneously during the latter half of the etching for further improving selectivity against the underlying silicon layer.

There is also disclosed in JP Patent KOKAI Publication No. 16-0938 a technique of etching silicon oxide using a mixed gas of hexafluorobenzene ($C_6F_6$) and tetrafluoromethane ($CF_4$) as an etching gas. With this technique, which is based on the concept similar to that shown in the above described present Inventors' proposal it contemplated to generate is $CF_x^+$ in a plasma efficiently by using cyclic unsaturated higher fluorocarbon gases, as well as to promote polymerization of the carbonaceous polymer.

It is noted that as will be apparent from above, it has been necessary with the previously proposed technique of employing straight-chain unsaturated fluorocarbon gases or cyclic unsaturated fluorocarbon gases to use other addition gases simultaneously for achieving high selectivity.

On the other hand, with the technique of employing $C_6F_6$, the etching gas can not be constituted by $C_6F_6$ alone, as stated in the specification of the JP Patent Publication which has disclosed the technique. It is because a large quantity of $CF_x^+$ ions are produced in the plasma with the use of $C_6F_6$ alone to promote polymerization of the carbonaceous polymer excessively to interfere with the progress of the etching reaction. For this reason, $CF_4$ having the lowest C/F ratio among the fluorocarbon gases is mixed with $C_6F_6$ for suppressing generation of $CF_x^+$.

Consequently, when the cyclic high fluorocarbon gases are employed, it is more meritorious to use such gas as may be used alone for improving etching stability and controllability.

OBJECT AND SUMMARY OF THE INVENTION

In view of the above described status of the art it is a principal object of the present invention to provide a dry etching method which is superior in etchrate, underlying layer selectivity, resist selectivity, low pollution and low damage based on the use as an etching gas of the cyclic higher fluorocarbon gases, which have hitherto not been used as an etching gas for the layer of the silicon compound, but which have now been found to be useful as a result of evaluation of the practical utilizability thereof.

In accordance with the present invention, an etching gas containing a saturated fluorocarbon compound $c-C_nF_{2n}$, c indicating being cyclic, including a cyclic portion in a molecular structure thereof, or an unsaturated fluorocarbon compound $c-C_nF_y$, c being the same as above and $y \leq 2n-2$, including a cyclic portion in a molecular structure thereof, is employed. With these compounds, since the number of carbon atoms per molecule is naturally three or more, the amount of generation of $CF_x^+$ per molecule is equal to or more than that achieved with the higher fluorocarbon gas previously proposed by the present Assignee. The result is the improved etchrate. If such gas is dissociated by plasma discharge, monoradicals, or occasionally biradicals, such as carbene, are also generated to attack the $\pi$ electron system in an unsaturated bond to accelerate polymerization of the carbonaceous polymer. Such carbonaceous polymer, if deposited on the surface of a layer of a silicon-based material, such as a single crystal silicon or a polycrystal silicon, or on the surface of a resist pattern, can not be removed easily by e.g. ionic impacts. However, the carbonaceous polymer deposited on the surface of a layer of a silicon compound, such as silicon oxide, can be removed easily because oxygen contained in the layer is sputtered out to contribute to decomposition of the carbonaceous polymer. Consequently, if the amount of deposition of the carbonaceous polymer is increased, resist selectivity and selectivity of the silicon underlying layer are improved.

It should however be noticed that if the C/F ratio is too low, underlying layer selectivity and resist selectivity are lowered due to excess $F^*$ radicals. Conventionally, $H_2$ or deposition gases were added for increasing the C/F ratio of the etching system. According to the present invention, the C/F ratio is increased by using a fluorocarbon compound having a carbon skeleton different from that used heretofore, without particularly employing the addition gases. It is on the basis of this concept that the cyclic compound rather than the straight-chain compound is used in accordance with the present invention.

That is, the number of fluorine atoms per molecule is less by two in the cyclic saturated fluorocarbon $c-C_nF_{2n+2}$ employed in the present invention than in the straight-chain saturated fluorocarbon $C_nF_{2n+2}$ having the same number of carbon atoms as that of the cyclic saturated fluorocarbon compound $c-C_nF_{2n+2}$. For this reason, the C/F ratio of the etching reaction system may be lower than heretofore without the necessity of employing the addition gases.

Meanwhile, when expressed by the general formula, the cyclic saturated fluorocarbon $c-C_nF_{2n+2}$ employed in the present invention is identical with the previously proposed straight-chain fluorocarbon having one double bond per molecule. It is therefore not wholly clear whether any significant difference exists between the C/F ratio increasing effects of these two compounds. It may however be predicted that significant difference would be produced in the state of dissociation in the plasma, molecular structure of the polymer deposited of the wafer surface, temperature dependency of selectivity or in the state of occurrence of damages to the underlying layer.

According to the present invention, the wafer temperature is controlled during etching to a temperature not higher than 50° C. The wafer temperature may be controlled to ambient temperature, or may also be controlled to be not higher than 0° C., as in low temperature etching which has recently attracted attention in the field of dry etching. During dry etching, the wafer temperature is raised to a temperature of the order of 200° C. in the absence of intentional cooling. However, if the temperature is control led to be 50° C. or lower, the carbonaceous polymer may be deposited efficiently due to the lowered vapor pressure, even although the deposition gases, such as hydrocarbon based gases, are not used or are used only in extremely small amounts, thereby enabling selectivity to be improved, as mentioned hereinabove. This also reduces the amount of addition of the deposition gases to diminish the risk of pollution by particles, while facilitating control of the etching reaction and maintenance of the etching apparatus.

Above all, if low temperature etching is effected by cooling the wafer to a temperature of 0° C. or lower, selectivity may be increased more significantly. Since etching of the resist material or the layer of the silicon-based material proceeds mainly on the basis of the chemical reaction by fluorine radicals F*, the etchrate is lowered if the temperature of the reaction system is lowered to suppress the motion of radicals. Conversely, etching of the layer of the silicon compounds, such as silicon oxide, proceeds by a physical process on the basis mainly of ion sputtering, so that the lowering of the etchrate by cooling is not displayed so conspicuously as when etching the resist material or the silicon-based material. The result is that selectivity is expected to be improved further in the low temperature range.

The present invention is highly effective for the preparation of the semiconductor devices designed in accordance with refined design rule and exhibiting high performance, high integration and high reliability.

BRIEF DESCRIPTION OF THE DRAWINGS

FIGS. 1a and 1b are schematic cross-sectional views for illustrating an example of application of, the present invention to processing of a contact hole, in the order of process steps, wherein FIG. 1a shows the state in which a resist pattern has been formed on an interlayer insulating film and FIG. 1b shows the state in which the contact hole has been formed.

DETAILED DESCRIPTION OF THE INVENTION

Figure 1A:
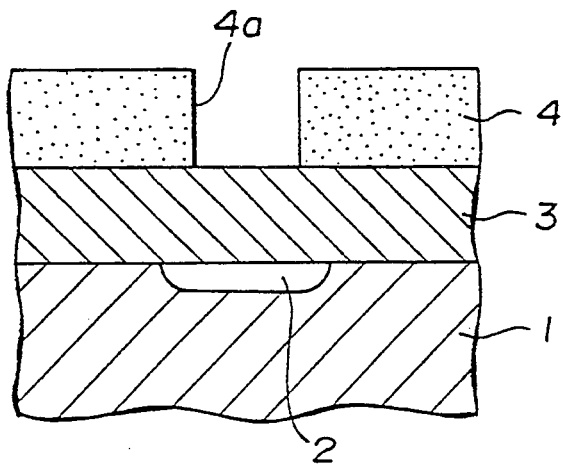

The present invention will be explained specifically hereinbelow.

The saturated fluorocarbon compound employed in accordance with the present invention is represented by the general formula $c\text{-}C_nF_{2n}$, n being an integer of not less than 3, and may be typified by a monocyclic compound having the following general formulas (i) to (v).

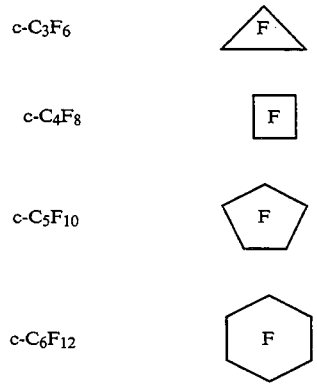

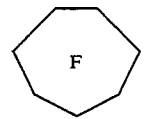

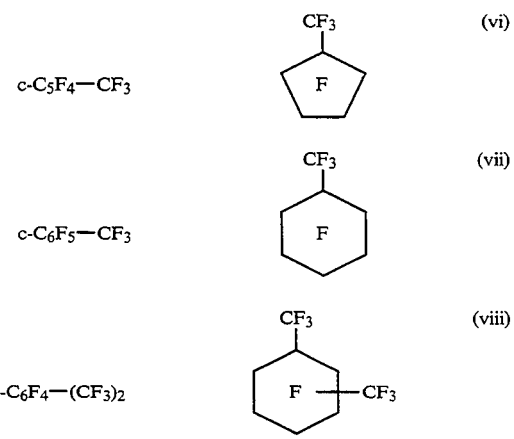

In each of the above structural formulas, F entered at the center of a carbon ring indicates that the hydrogen atoms of each of the hydrocarbon compounds having the same carbon skeletons are unanimously substituted by fluorine atoms, this style of expression being used throughout the present specification.

Although the compounds having 3- to 7-membered rings are shown in the formulas (i) to (v), any compounds having larger size carbon rings may also be used, if these compounds are producible technologically and may exist stably.

As structural isomers of the above mentioned monocyclic compounds, compounds having perfluoroalkyl groups, as shown by the following formulas (vi) to (viii), in the side chains thereof, may be exemplified.

In the above formulas (vi) to (viii), trifluoromethyl groups are contained in the side chains of the structural isomers. Since these compounds are liquid under normal pressure and temperature, it is necessary to effect heating or bubbling using an inert gas in order for these compounds to be introduced into the etching reaction system.

On the other hand, the unsaturated fluorocarbon compound employed in accordance with the present invention is represented by the general formula $c\text{-}C_nF_y$, where n is an integer of not less than 3 and $y \leq 2n-2$, and may be typified by a monocyclic compound represented by the following general formulas (ix) to (xii).

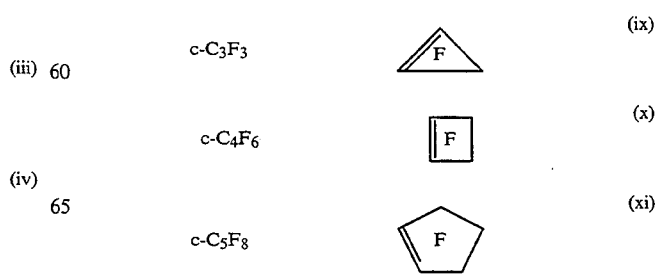

$c-C_6F_{10}$  (xii)

Although the compounds having 3- to 6-membered rings, each containing a double bond, are shown in the formulas (ix) to (xii), any compounds having larger size carbon rings may also be used, if these compounds are producible technologically and may exist stably. Although more than one unsaturated bond may be present in each carbon ring, since the etching gas can not be constituted solely by $C_6F_6$, having the C/F ratio equal to unity, as mentioned hereinabove, it is not desirable that excess unsaturated bonds exist in the molecule to increase the C/F ratio excessively. For this reason, the C/F ratio less than unity is desirable.

Besides, structural isomers of the above mentioned unsaturated fluorocarbon compounds may also be enumerated, such as those in which perfluoroalkyl groups are bonded to the unsaturated ring, those in which unsaturated chains, such as perfluorovinyl groups are bonded to the unsaturated ring or those in which unsaturated chains such as perfluorovinyl groups are bonded to the saturated ring.

Meanwhile, according to the present invention, $c-C_nF_{2n}$ or $c-C_nF_y$ may be mixed together or mixed with other gases, depending on particular applications. The etching process may be divided into plural steps in each of which a specific gas system may be employed.

For example, as far as the C/F ratio is concerned, the $c-C_nF_{2n}$ is preferred to $c-C_nF_y$ in achieving a high etchrate, while $c-C_nF_y$ is preferred to $c-C_nF_{2n}$ in achieving high selectivity. Thus it may be contemplated to perform (a) low temperature etching using a mixed gas composed of $c-C_nF_{2n}$ added to by a small quantity of $c-C_nF_y$, or (b) etching of a layer of a silicon compound using a unitary gas system of $c-C_nF_{2n}$ until immediately before exposure of the underlying layer, followed by etching and overetching of the remaining portion of the layer using a mixed gas of $c-C_nF_{2n}$ and $c-C_nF_y$ with high selectivity.

Alternatively, it may be contemplated (c) to perform the latter etching stage of the two-stage etching (b) using a mixed gas composed of $c-C_nF_{2n}$ and deposition gases.

Still alternatively, since it may be feared that $c-C_nF_{2n}$ and $c-C_nF_{2n}$ may lower the etchrate as compared with straight-chain saturated fluorocarbon compounds $C_nF_{2n+2}$, it may be contemplated to use an etching gas composed mainly of $C_nF_{2n+2}$ to which $c-C_nF_{2n}$ or $c-C_nF_y$ are added as an addition gas. Thus it may be contemplated to perform (d) low temperature etching using a mixed gas composed of $c-C_nF_{2n+2}$ and $c-C_nF_{2n}$ or $c-C_nF_y$, or (e) etching of a layer of a silicon compound using a unitary gas system of $c-C_nF_{2n+2}$ until immediately before exposure of the underlying layer, followed by etching and overetching of the remaining portion of the layer using a mixed gas of $c-C_nF_{2n+2}$ and $c-C_nF_{2n}$ or $c-C_nF_y$ with high selectivity.

PREFERRED EMBODIMENTS

The present invention will be explained with reference to several illustrative Examples. It is noted that a process employing $c-C_nF_{2n}$ or $c-C_nF_y$ alone, a process employing a combination of $c-C_nF_{2n}$ and $c-C_nF_y$, a process employing a combination of $c-C_nF_{2n}$ and a deposition gas, a process employing a combination of $C_nF_{2n+2}$ as a straight-chain saturated fluorocarbon with $c-C_nF_{2n}$ or $c-C_nF_y$, are explained in Examples 1 to 3, Example 4, Example 5 and Examples 6 to 8, respectively.

Example 1

In the present Example 1, the present invention is applied to processing of a contact hole, and a silicon oxide interlayer insulating film is etched using $c-C_4F_8$ shown by the formula (ii) (octafluorocyclobutane, also known as Flon C318, with C/F=0.5). The process is explained by referring to FIGS. 1a and 1b.

Referring first to FIG. 1a, an interlayer insulating film 3 was formed on a single crystal silicon substrate 1, on which an impurity diffusion layer 2 was previously formed, and a resist pattern 4 was formed as an etching mask on the insulating film 3. An aperture 4a was previously formed in the resist pattern 4 by predetermined patterning.

The wafer thus prepared was set on a wafer setting electrode of a magnetron reactive ion etching (RIE)device. Meanwhile, a cooling conduit is housed in the wafer setting electrode, so that by circulating a cooling medium through the cooling conduit from an external chiller, the wafer temperature may be controlled to be 50° C. or lower. Meanwhile, ethanol was used as a cooling medium. As typical etching conditions, a $c-C_4F_8$ flow rate of 46 SCCM, a gas pressure of 2 Pa, an RF bias power density of 2.2 W/cm$^2$ (2 MHz), a magnetic field strength of $1.5 \times 10^{-2}$ T (150 Gauss) and a wafer temperature of 0° C., were employed.

Although $c-C_4F_8$ differs slightly in physical properties from one reference literature to another, it is a compound which is gaseous at ambient temperature and has a melting point and a boiling point of about $-40°$ C. and about $-6°$ C., respectively.

Figure 1B:
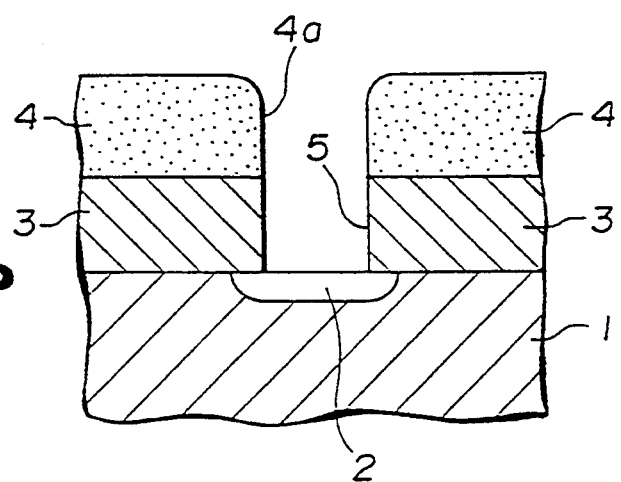

In the above mentioned etching process, etching of the interlayer insulating film 3 proceeds on the basis mainly of an ion assisted reaction in which the reaction assisting $CF_x^+$ ions are yielded by discharge dissociation of $c-C_4F_8$ in a plasma. Although a carbonaceous polymer, not shown, was deposited efficiently on the surface of the resist pattern 4, the carbonaceous polymer was also removed on the su trace of the interlayer insulating film 3 exposed within the aperture 4a with the progress of removal of the insulating film 3. As a result thereof, a contact hole 5 exhibiting satisfactory shape anisotropy could be formed promptly, as shown in FIG. 1b, although the deposition gas, such as hydrocarbon based gas, was not added to the gas system. During this process, the etchrate of the interlayer insulating film was 701 nm/minute, while resist selectivity and silicon selectivity were 3.5 and 7.2, respectively.

For comparison sake, $C_3F_8$ (octafluoropropane having the C/F ratio of 0.375) was selected as a straight-chain saturated fluorocarbon gas having the same number of fluorine atoms as that of the above mentioned $c-C_4F_8$ so as to be used for etching the interlayer insulating film under the same conditions as those shown above. It was found that the etchrate as 734 rim/minute, while resist selectivity and silicon selectivity were 1.5 and 3.9, respectively.

On comparing the results of etching by $c-C_4F_8$ and $C_3F_8$ to each other, $c-C_4F_8$ is markedly superior in point of resist selectivity and silicon selectivity because c–$C_4F_8$ has a higher C/F ratio than $C_3F_8$ so that generation of excess F* radicals responsible for lowered selectivity is suppressed. On the other hand, c–$C_4F_8$ is slightly inferior as far as the etchrate is concerned, because more carbonaceous polymer is deposited when using c–$C_4F_8$ so that removal of the carbonaceous polymer by sputtering occurs competitively with etching. However, since the etchrate is lowered only slightly, while selectivity is improved noticeably, it may be said that using the cyclic saturated fluorocarbon compounds gives rise to significant practical merits.

Example 2

In the present Example 2, the present invention is applied to processing of a contact hole, and a silicon oxide interlayer insulating film is etched using c–$C_4F_6$ shown by the formula (x) (hexafluorocyclobutene, also known as Flon C1316, with C/F=0.67).

A wafer similar to that of Example 1 was set on a magnetron RIE device and, as typical etching conditions, a c–$C_4F_6$ flow rate of 50 SCCM, a gas pressure of 2 Pa, an RF bias power density of 1.5 W/cm$^2$ (2 MHz), a magnetic field strength of $1.5 \times 10^{-2}$ T (150 Gauss) and a wafer temperature of 0° C., were employed.

Although c–$C_4F_6$ differs slightly in physical properties from one reference literature to another, it is a compound which is gaseous at ambient temperature and has a melting point and a boiling point of about −60° C. and about 5° to 6° C., respectively.

With this etching, a contact hole with satisfactory shape anisotropy could be obtained. Resist selectivity and silicon selectivity, which were about 4 and about 12, respectively, were improved as compared with the case of using c–$C_4F_8$ as in Example 1. The reason is that c–$C_4F_6$, having a double bond per molecule, is further increased in the C/F ratio to promote deposition of the carbonaceous polymer.

Example 3

In the present Example 3, the present invention is applied to processing of a contact hole, and a silicon oxide interlayer insulating film is etched using c–$C_5F_8$ shown by the formula (xi) (octafluorocyclopentene, also known as Flon C1418, with C/F=(0.625).

A wafer similar to that of Example 1 was set on a magnetron RIE device and, as typical etching conditions, a c–$C_5F_8$ flow rate of 50 SCCM, a gas pressure of 2 Pa, an RF bias power density of 1.5 W/cm$^2$ (2 MHz), a magnetic field strength of $1.5 \times 10^{-2}$ T (150 Gauss) and a wafer temperature of 0° C., were employed. Although c–$C_5F_8$ differs slightly in physical properties from one reference literature to another, it is a compound which is gaseous at ambient temperature and has a melting point and a boiling point of about −40° C. and about 6° C., respectively.

With this etching, a contact hole with satisfactory shape anisotropy could be obtained. The etchrate was improved as compared to the case of using c–$C_4F_6$ of Example 2. This is in keeping with the C/F ratio being lower with c–$C_5F_8$ than with c–$C_4F_6$.

In the preceding Examples 1 to 3, etching was performed using a lone gas system. The gas system is not admixed with deposition gases and hence there is no risk of the particle level being worsened even after the processing of a number of wafers in a wafer-by-wafer etching device, so that the device yield ratio may be improved while the time necessary for maintenance of the etching system may be shortened significantly.

Example 4

In the present Example, an interlayer insulating film was etched, using c–$C_4F_8$, until immediately before the underlying layer was exposed, the remaining portion of the interlayer insulating film being etched and overetched using a mixed gas of c–$C_4F_8$ and c–$C_4F_6$. This process will be explained by referring to FIGS. 1a and 1b and also to FIG. 2.

A wafer such as shown in FIG. 1a was set on a magneton RIE device and an interlayer insulating film 3 was etched until immediately before a single crystal silicon substrate 1, more precisely, an impurity diffusion layer, was exposed, under the conditions of a c–$C_4F_8$ flow rate of 50 SCCM, a gas pressure of 2 Pa, an RF power density of 2.0 W/cm$^2$ (2 MHz), a magnetic field strength of $1.5 \times 10^{-2}$ T (150 Gauss), and a water temperature of 20° C.

Figure 2:
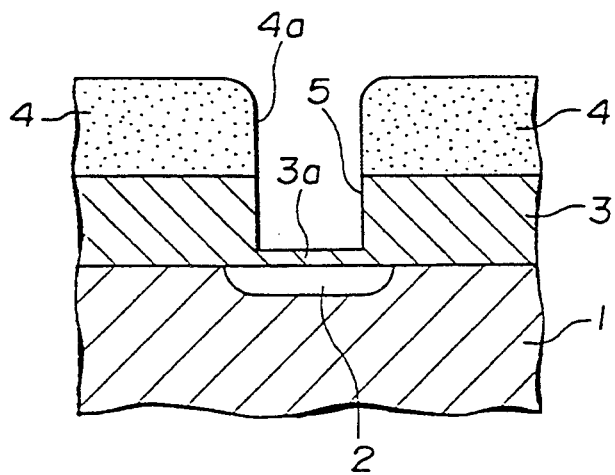
FIG. 2a is a schematic cross-sectional view showing an example of application of the present invention to processing of contact holes by two-stage etching, with the contact hole having been formed halfway.

The etching end point was determined as being a point at which the intensity of the CO* emission spectrum at 483.5 nm started to be decreased. As a result of the first stage etching, the state of the wafer was such that as shown in FIG. 2, a contact hole 5 was formed halfway and a remaining portion 3a of the interlayer insulating film 3 was left at the bottom of the contact hole 5.

The remaining portion 3a was etched and overetched by changing over the etching conditions to, for example, a c–$C_4F_8$ flow rate of 40 SCCM, a c–$C_4F_6$ flow rate of 10 SCCM, an RF bias power density of 1.0 W/cm$_2$ (2 MHz), a magnetic field density of $1.5 \times 10^{-2}$ T (150 Gauss), and a water temperature of 20° C.

With this second stage etching, a contact hole 5 with satisfactory shape anisotropy could be formed, without damaging the underlying impurity diffusion layer 2, as shown in FIG. 1b.

The above process is based on the concept that the first stage etching is effected with a higher etchrate and, during the second stage etching, a gas having a higher C/F ratio is added and the RF power density is lowered to diminish the incident ionic energy to elevate underlying layer selectivity. Consequently, high anisotropy and high selectivity could be achieved although wafer cooling to 0° C. or lower was not performed.

Example 5

In the present Example, a contact hole was formed by the two-stage etching as described in Example 4, using c–$C_4F_8$ in the first stage and a mixed gas of c–$C_4F_8$ and $C_2H_4$ in the second stage.

The first stage etching was carried out under typical etching conditions of a c–$C_4F_8$ flow rate of 50 SCCM, a gas pressure of 2 Pa, an RF bias power density of 2 W/cm$^2$ (2 MHz), a magnetic field strength of $1.5 \times 10^{-2}$ T (150 Gauss) and a wafer temperature of 20° C.

The second stage etching or overetching was carried out under typical etching conditions of a c–$C_4F_8$ flow rate of 46 SCCM, a $C_2H_4$ flow rate of 4 SCCM, a gas pressure of 4 Pa, an RF bias power density of 1.0 W/cm$^2$ (2 MHz), a magnetic field strength of $1.5 \times 10^{-2}$ T (150 Gauss) and a wafer temperature of 20° C.

It is noted that $C_2H_4$ added for the second stage etching, which itself is a deposition gas, has the effects of yielding H* radicals due to discharge dissociation to capture excess F* radicals to increase the C/F ratio of the etching system. High anisotropy, high selectivity and low damage could also be achieved with the present Example.

Example 6

In the present Example 6, a contact hole was formed by low temperature etching, using a mixed gas, composed mainly of $C_3F_8$, a straight-chain saturated fluorocarbon gas, added to by $c-C_4F_8$, as an etching gas.

As typical etching conditions, a $C_3F_8$ flow rate of 30 SCCM, a $c-C_4F_8$ flow rate of 20 SCCM, a gas pressure of 2 Pa, an RF bias power density of 1.5 W/cm$^2$ (2 MHz), a magnetic field density of $1.5 \times 10^{-2}$ T (150 Gauss) and a wafer temperature of $-30°$ C.

With the present process, $C_3F_8$ having a lower C/F ratio was used as a main component of the etching gas to place emphasis on a high etchrate, while $c-C_4F_8$ having a higher C/F ratio was used as an addition gas to achieve high selectivity and low damage, and the wafer was cooled to a lower temperature for etching. With the present example, high etchrate, high shape anisotropy, high selectivity and low damage were achieved.

Example 7

In the present Example, a contact hole was formed by low temperature etching, using a mixed gas composed mainly of $C_3F_8$, as in Example 6, added to by $c-C_7F_{14}$ of formula (v), as an etching gas.

As typical etching conditions, a $C_3F_8$ flow rate of 45 SCCM, a $c-C_7F_{14}$ flow rate of 5 SCCM, a gas pressure of 2 Pa, an RF bias power density of 1.5 W/cm$^2$ (2 MHz), a magnetic field strength of $1.5 \times 10^{-2}$ T (150 Gauss) and a water temperature of $-30°$ C.

With the present example, high etchrate, high shape anisotropy, high selectivity and low damage were achieved.

Example 8

In the present Example, a contact hole was formed by low temperature etching, using a mixed gas, composed of equal amounts of $C_3F_8$ and $c-C_4F_6$, as an etching gas.

As typical etching conditions, a $C_3F_8$ flow rate of 25 SCCM, a $c-C_4F_6$ flow rate of 25 SCCM, a gas pressure of 2 Pa, an RF bias power density of 1.5 W/cm$^2$ (2 MHz), a magnetic field strength of $1.5 \times 10^{-2}$ T (150 Gauss) and a wafer temperature of $-30°$ C.

With the present example, high etchrate, high shape anisotropy, high selectivity and low damage were achieved.

Although the present invention has been explained with reference to eight illustrative Examples, the present invention is not limited to these Examples. For example, $H_2$, $O_2$ or the like gases may also be added to the above gas systems for controlling the etchrate, whilst rare gases such as He or Ar may also be added thereto in expectation of sputtering, dilution or cooling effects.

Besides, the layer of the material to be etched is not, limited to silicon oxide mentioned above but may also be PSG, BSG, BPSG, AsSG, AsPSG, AsBSG or SiN.

What is claimed is:

1. A dry etching method comprising etching a layer of a silicon compound formed on a substrate using an etching gas plasma containing a saturated fluorocarbon compound having a cyclic portion in at least a portion of a molecular structure thereof, said substrate being controlled to a temperature of not higher than 50° C. during etching, wherein said etching gas also contrives a straight chain unsaturated fluorocarbon compound.

2. A dry etching method as claimed in claim 1 wherein said cyclic portion of the saturated fluorocarbon compound includes a 3- to 7-membered ring.

3. A dry etching method as claimed in claim 1 wherein said saturated fluorocarbon compound consists of 3 to 8 carbon atoms.

4. A dry etching method as claimed in claim 1 wherein the layer of the silicon compound is a layer of a silicon oxide based material or a silicon nitride based material.

5. A dry etching method as claimed in claim 1 wherein said etching gas also contains a straight-chain saturated fluorocarbon compound.

6. A dry etching method comprising etching a layer of a silicon compound formed on a substrate using an etching gas plasma containing a unsaturated fluorocarbon compound having a cyclic portion in at least a portion of a molecular structure thereof, said substrate being controlled to a temperature of not higher than 50° C. during etching.

7. A dry etching method as claimed in claim 6 wherein said cyclic portion of said unsaturated fluorocarbon compound contains an unsaturated bond and wherein said cyclic portion includes a 3- to 6-membered ring.

8. A dry etching method as claimed in claim 6 wherein the layer of the silicon compound is a layer of a silicon oxide based material or a silicon nitride based material.

9. A dry etching method as claimed in claim 6 wherein said etching gas also contains a straight-chain saturated fluorocarbon compound.

10. A dry etching method comprising etching a layer of a silicon compound formed on a substrate using an etching gas plasma containing a saturated fluorocarbon compound having a cyclic portion in at least a portion of a molecular structure thereof and an unsaturated fluorocarbon compound having a cyclic portion in at least a portion of a molecular structure thereof, said substrate being controlled to a temperature of not higher than 50° C. during etching.

11. A dry etching method as claimed in claim 10 wherein said cyclic portion of the saturated fluorocarbon compound includes a 3- to 7-membered ring.

12. A dry etching method as claimed in claim 10 wherein said saturated fluorocarbon compound consists of 3 to 8 carbon atoms.

13. A dry etching method as claimed in claim 10 wherein said cyclic portion of said unsaturated fluorocarbon compound contains an unsaturated bond and wherein said cyclic portion includes a 3- to 6-membered ring.

14. A dry etching method as claimed in claim 10 wherein the layer of the silicon compound is a layer of a silicon oxide based material or a silicon nitride based material.

* * * * *